United States Patent [19]
Sohn et al.

[11] Patent Number: 5,457,481
[45] Date of Patent: Oct. 10, 1995

[54] MEMORY SYSTEM FOR USE IN A MOVING IMAGE DECODING PROCESSOR EMPLOYING MOTION COMPENSATION TECHNIQUE

[75] Inventors: Chang Sohn; Oh-Sang Kwon, both of Seoul, Rep. of Korea

[73] Assignee: Daewoo Electronics Co., Ltd., Seoul, Rep. of Korea

[21] Appl. No.: 133,622

[22] Filed: Oct. 7, 1993

[30] Foreign Application Priority Data

Oct. 7, 1992 [KR] Rep. of Korea ............. 1992-18396

[51] Int. Cl.⁶ ........................................... G09G 1/02
[52] U.S. Cl. ..................... 345/185; 348/407; 348/416
[58] Field of Search .......................... 348/407, 416, 348/420, 699, 700, 701; 345/185, 196, 201

[56] References Cited

U.S. PATENT DOCUMENTS 4,445,115  4/1984  Rudgard ......................... 345/201
4,691,230  9/1987  Kaneko et al. .................. 348/416
5,089,887  2/1992  Robert et al. ................... 348/416 X
5,121,202  6/1992  Tanoi ............................ 348/416
5,204,740  4/1993  Ishii ............................. 348/416

*Primary Examiner*—Ulysses Weldon
*Attorney, Agent, or Firm*—William F. Pinsak

[57] ABSTRACT

A memory apparatus for use in a receiver for decoding video signals comprises a first memory for storing an image frame; a second memory for storing current pixel data temporally and providing the same to said first memory; an address generator for generating address signals for sequentially addressing two-dimensional pixels in the blocks; a delay unit for delaying said address signals by a predetermined delay time in generating write address signals for said first memory; an offset unit for comparing the said address signals with an offset address so as to prohibit the provision of write address signals to said first memory until one of said address signals reaches to said offset address; and a control circuit for selectively providing the read address signals and the write address signals to said first memory.

1 Claim, 3 Drawing Sheets

MEMORY SYSTEM FOR USE IN A MOVING IMAGE DECODING PROCESSOR EMPLOYING MOTION COMPENSATION TECHNIQUE

FIELD OF THE INVENTION

The present invention relates to a memory system for use in a receiver for decoding compressed image signals; and, more particularly, to an efficient memory system capable of performing motion compensation with a reduced memory size.

DESCRIPTION OF THE PRIOR ART

In various electronic/electrical applications such as high definition television and video telephone systems, an image signal may need to be transmitted in a digitized form. When the image signal comprising a sequence of image "frames" is expressed in a digitized form, there is bound to occur a substantial amount of digital data: for each line of an image frame is defined by a sequence of digital data elements referred to as "pixels". Since, however, the available frequency bandwidth of a conventional transmission channel is limited, in order to transmit the substantial amounts of digital data, e.g., about 900 Mbits per second, through the limited channel bandwidth, e.g., of 6 MHz, it is inevitable to compress the image signal. Among various video compression techniques, the so-called hybrid coding technique, which combines spatial and temporal compression techniques, is known in the art to be most effective.

Most hybrid coding techniques employ a motion-compensated DPCM (Differential Pulse Code Modulation), two-dimensional DCT (discrete Cosine Transform), quantization of DCT coefficients, RLC (Run-Length Coding) and VLC (Variable Length Coding). The motion-compensated DPCM, wherein an image frame is divided into a plurality of subimages (or blocks), is a process of determining the movement of an object between a block of a current frame and a corresponding block of its previous frame, and predicting the current frame according to the motion flow to produce a predictive error signal representing the difference between the current frame and its prediction. This method is described, for example, in Staffan Ericsson, "Fixed and Adaptive Predictors for Hybrid Predictive/Transform Coding", *IEEE Transactions on Communications, COM*-33, No.12(December 1985); and in Ninomiya and Ohtsuba, "A Motion-Compensated Interframe Coding Scheme for Television Pictures", *IEEE Transactions on Communications, COM*-30, No.1(January 1982).

The two dimensional DCT converts a block of, e.g., 8×8 pixels into a set of transform coefficients. This technique is described in Chen and Pratt, "Scene Adaptive Coder", *IEEE Transactions on Communications, COM*-32, No. 3(March 1984). By processing such transform coefficients with a quantizer, zigzag scanning, RLC and VLC, the amount of data to be transmitted can be effectively compressed. The motion vectors obtained by the motion-compensated DPCM are also coded by VLC. By definition, a motion vector operates from a base, which is a current pixel projected on its preceding frame, to a head which is a pixel in the preceding frame. The motion vector and the predictive error signal are transmitted to a receiver. A prior art receiver, therefore, includes a variable length decoder, a run-length decoder, an inverse zigzag scanner, an inverse quantizer, an inverse DCT means and a frame memory.

Motion compensation in the receiver is an operation of deriving pixel data of a current frame from a pixel position in its previous frame shifted with a motion vector and adding it to a difference signal, which is obtained by processing the predictive error signal through an initial implementation of the receiver (i.e., through a variable length decoder, a run-length decoder, an inverse zigzag scanner, an inverse quantizer and an inverse DCT means), so as to generate a current frame data. A digital image processing system for performing the motion compensation needs two full frame memories: a previous frame memory; for storing a previous frame data for motion compensation and a current frame memory for storing a current frame data obtained by adding a difference signal and a motion compensated previous frame data. As a result, a prior art receiver with the two memories have the disadvantages of higher cost and bulkier volume.

SUMMARY OF INVENTION

According, it is an object of the present invention to provide a memory system for use in a decoder incorporated in a receiver of digitally transmitted image signals which is capable of carrying out motion compensation effectively with a reduced memory size.

In accordance with the present invention, there is provided a memory system for use in a receiver for decoding video signals digitized, comprising:

first memory means for storing an image frame;

second memory means for storing current pixel data temporally and providing the same to said first memory means;

means for generating address signals for sequentially addressing two-dimensional pixels in the blocks;

means for delaying said address signals by a predetermined delay time in generating write address signals for said first memory means;

means for comparing the said address signals with an offset address so as to prohibit the provision of write address signals to said first memory means until one of said address signals reaches to said offset address; and means for selectively providing the read address signals and the write address signals to said first memory means.

BRIEF DESCRIPTION OF THE DRAWINGS

The above and other objects and features of the instant invention will become apparent from the following description of preferred embodiments given in conjunction with the accompanying drawing, in which.

DESCRIPTION OF THE PREFERRED EMBODIMENT

Figure 1:
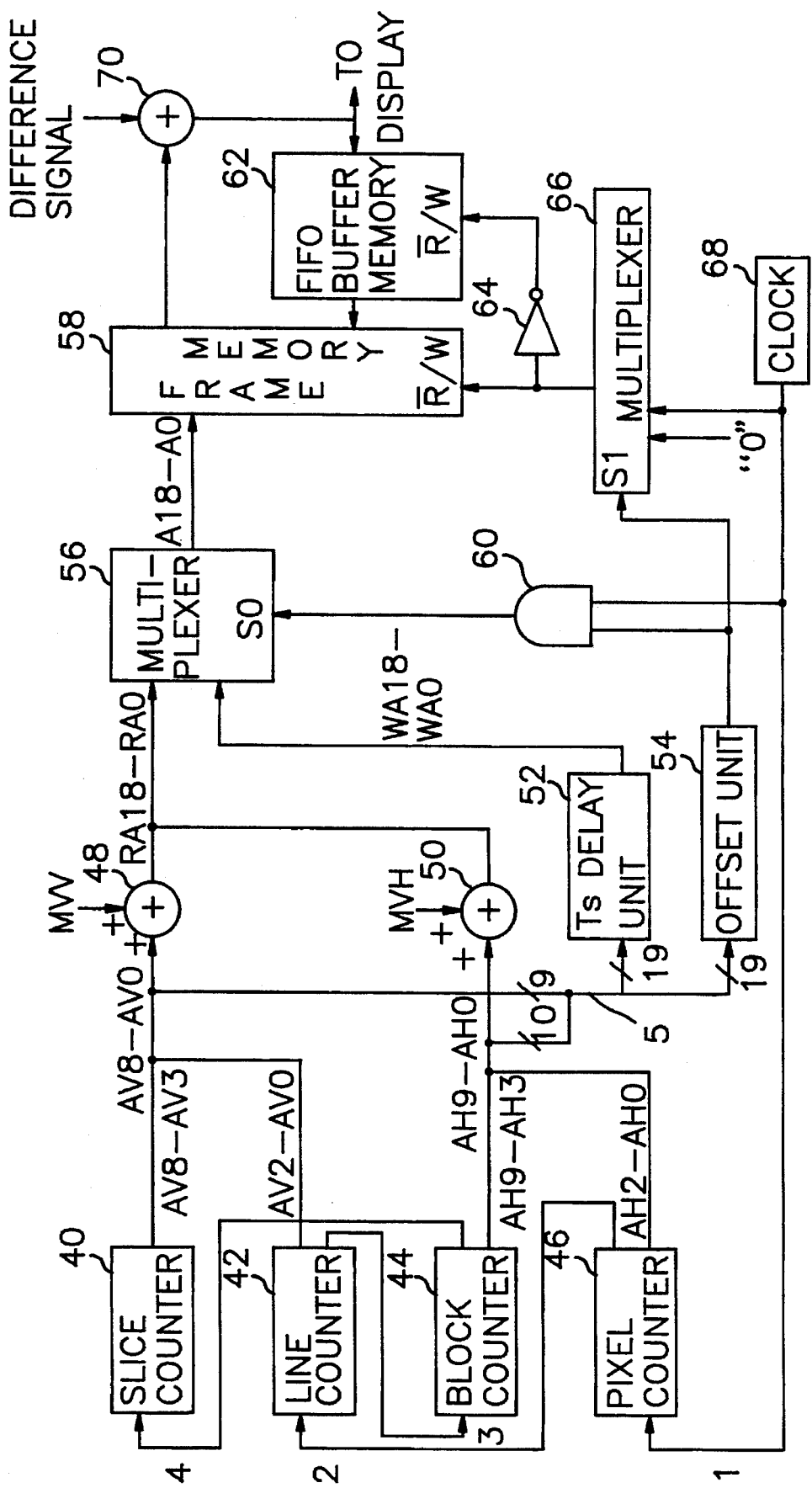
FIG. 1 is a block diagram depicting a memory system using a frame memory and a buffer memory in accordance with the present invention.
Figure 2:
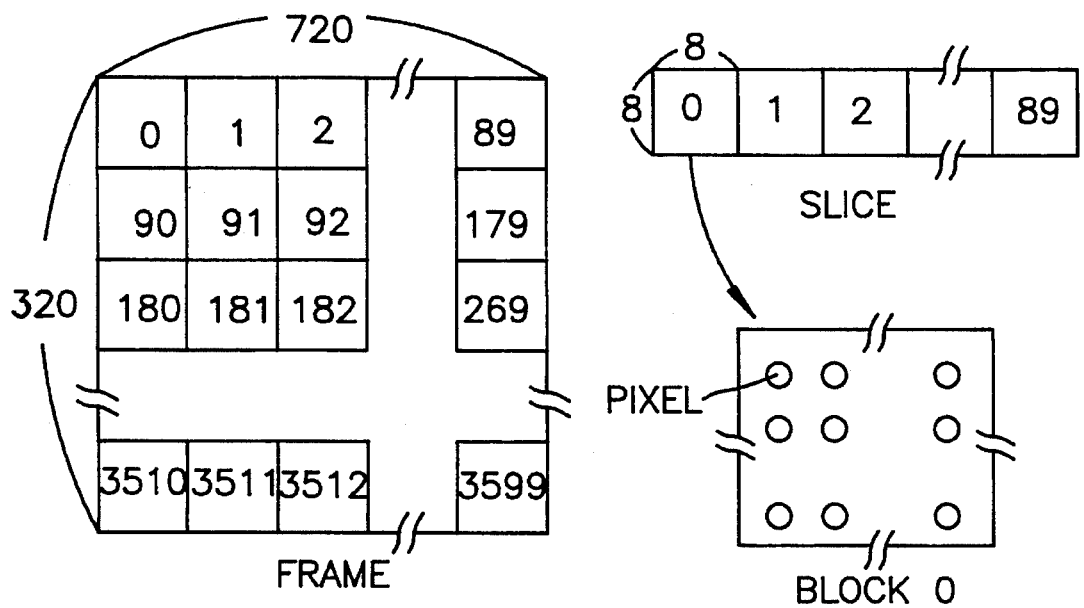
FIG. 2 shows an exemplary image formatting structures of a frame.

FIG. 1 shows a memory system comprising a frame memory 58 and a buffer memory 62 in accordance with the present invention. The frame memory stores a portion of previous frame data which will be used for motion compensation of a current frame and a portion of the current frame data in the rest part of the memory. A FIFO (First-In First-Out) buffer memory 62 temporarily stores motion compensated current frame data and provides them to the frame memory in accordance with the invention. Read and write addressing for the memory 58 is performed in accordance with image formatting structures of a frame. Referring to FIG. 2, there is illustrated an exemplary frame of 720×320 pixels having 40 slices, each of which is formed by 90 blocks. In digital signal processing, a block which has, e.g., 8×8 pixels, is a basic processing unit used, e.g., in DCT and VLC. Referring back to FIG. 1, memory addressing is carried out block-by-block basis.

Specifically, a pixel counter 46 generates in sequence 3 bit column address signals of AH2–AH0 in response to the clock signals via line from a clock 68. Those 3 bit address signals are used for addressing sequentially 8 pixels in a row of a block. In every 3 bit 8 column address signal generation, carries are generated by the pixel counter 46 and provided to a line counter 42 through a line 2. In response to the carries from the pixel counter 46, 3 bit 8 row address signals AV2–AV0 of the pixels in the block are generated from the line counter 42. The column address signals of AH2–AH0 and the row address signals of AV2–AV0 define all 8×8 pixels of a block. Carries are then generated from the line counter 42 in every 8 row address signals to feed to a block counter 44 via a line 3.

From the block counter 44, 7 bit AH9–AH3 column address signals are provided in response to the carries from the line counter 42, thereby designating next block positions of a slice in the frame memory 58.

After filling up one slice with blocks, i.e., by generating 7 bit AH9–AH3 column address signals designating, e.g., 90 blocks shown in FIG. 2, a carry is generated from the block counter 44 and fed to a slice counter 40 which generates 6 bit row address signals of AV8–AV3 to, thereby, designate next slice positions until the frame is filled by, e.g., 40 slices as shown in FIG. 2. The process is carried out repeatedly by resetting the counters 40, 42, 44 and 46 for every frame.

The row address signal AV2–AV0 from the line counter 42 and AV8–AV3 from the slice counter 40 is combined to form 9 bit column signal AV8–AV0 and fed to a first adder 48 wherein the vertical component MVV of a respective motion vector of a pixel from, e.g., a variable length decoder (not shown) are added thereto.

The combined 10 bit column address signal AH9–AH0 composed of 3 bit column signal AH2–AH0 from the pixel counter 46 and 7 bit column signal AH9–AH3 from the block counter 44 are summed up with the horizontal component MVH of the respective motion vector of the pixel in the second adder 50.

The 19 bit address signal from the first second address 48 and 50 are provided to a first multiplexer 56 as a read address RA18–RA0 which is used for designating a previous frame pixel data stored in the frame memory 58 for the motion compensation.

Figure 3:
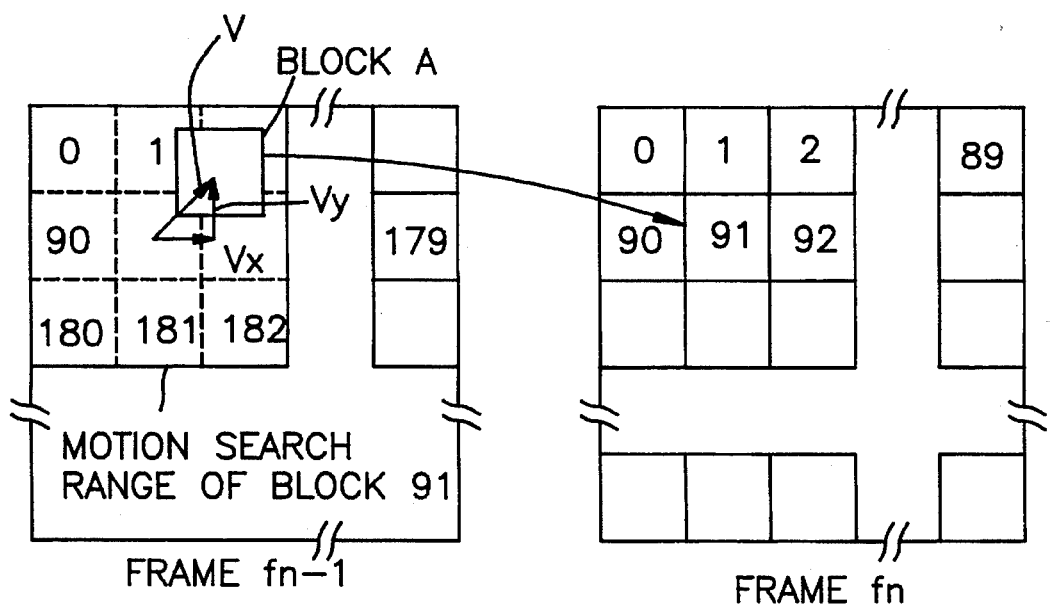
FIG. 3 is depicts a block matching technique for motion estimation.

In the mean time the column address signal AH9–AH0 and the row address signal AV8–AV0 are fed through a line 5 to a $T_s$ delay unit 52 and on offset unit 54. Referring to FIG. 3, there is illustrated a block matching technique which sums the mean square difference (or similar function) between each pixel of corresponding blocks in adjacent frames. This calculation is performed with a range of different spatial offsets between the blocks and the offset that gives the minimum error is taken as the motion vector for that block. When a motion search range is from −8 to +8 pixels in both the vertical and horizontal directions, the block matching of a block 91 in a frame $f_n$ is performed in a motion search range of its previous frame $f_{n-1}$. There are also illustrated a motion vector V and its vertical and horizontal components $V_y$ and $V_x$ for a matched block A in the frame $f_{n-1}$ of the frame 91 in the frame $f_n$. Referring to FIGS. 2 and 3, pixel data of a first slice formed by blocks 0–89 and a block 90 of a previous frame stored a memory, e.g., frame memory 58 in FIG. 1, cannot be replaced with motion compensated pixel data of a current frame: for those blocks are within motion search range of following blocks, e.g., of 91 to 179, of the current frame. After the completion of the motion compensation for a first pixel in a block 91 of the current frame, however, a first pixel data in the block 0 of the previous frame can be replaced with a corresponding pixel, i.e., a first pixel in a block 0 of the current frame. A memory size of the FIFO buffer memory 62 in FIG. 1, therefore, is selected to be "one slice and one block" in accordance with the invention.

Figure 4:
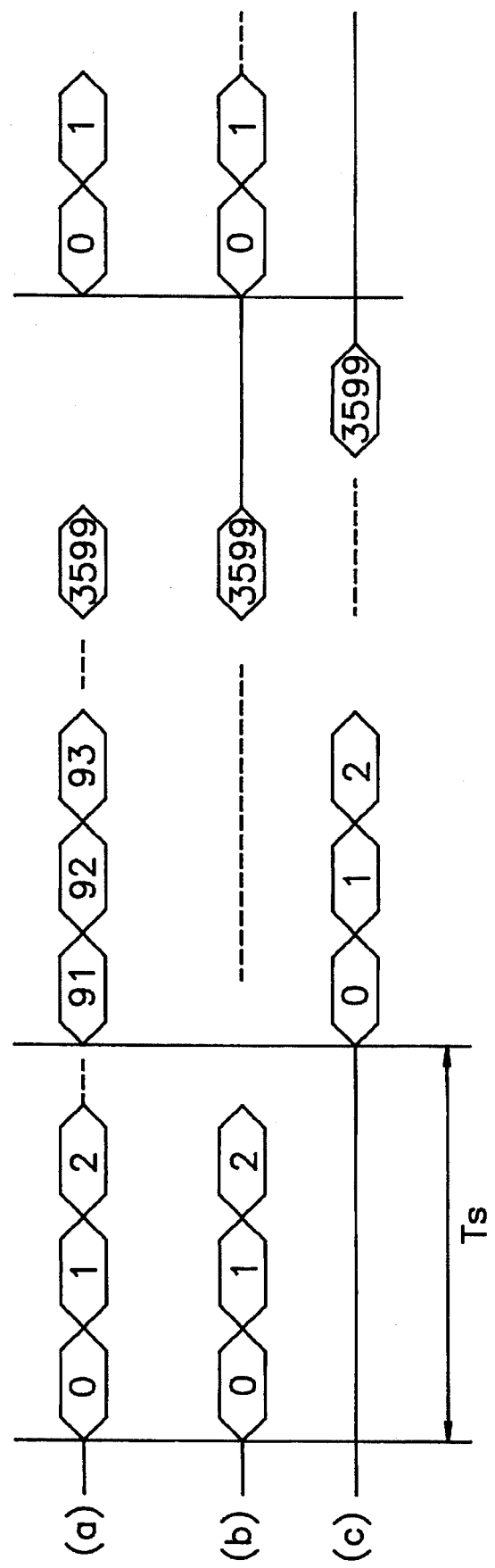
FIG. 4 is a timing diagram illustrating read/write memory cycles operating in an inventive memory system.

Referring back to FIG. 1, 19 bit address signal including AV8–AV0 and AH9–AH0 is fed to the $T_s$ delay unit 52 and the offset unit 54 via line 5. In the $T_s$ delay unit 52, the 19 bit address signal is delayed by a delay time $T_s$, which represents time for processing pixels in one slice and one block, and applied to the first multiplexer 56 as write address signal WA18–WA0. The offset unit compares the input address signal with an offset address, which is defined herein as an address of the first pixel position of the block 91 (that is, the pixel on the top-left corner thereof). The offset unit 54 generate "0" when the input address falls within the offset address, i.e., the input address corresponds to one of pixel positions in the blocks of 0 to 90 in FIG. 2, and generates "1" otherwise. An output signal of either "0" or "1" are fed to an AND gate 60 together with the clock signal from the clock 68 and to a selection terminal S1 of a second multiplexer 66 having two input terminals for logic "0" and the clock signal. The AND gate 60 outputs "0" to a selection terminal S0 of the first multiplexer 56, thereby enabling the first multiplexer 56 to dispatch the read address signal RA18–RA0 as an output signal A18–A0 to the frame memory 58. In the mean time, the output signal "0" from the offset unit 54 is fed to a second multiplexer 66 which select the logic "0" as an output. The output signal "0" is applied to a control terminal R/W of the frame memory 58 thereby enabling the input signal A18–A0 thereto to perform read operation; and to a control terminal R/W of a FIFO buffer memory 62 via a inverter 64, which converts output signal "0" from the second multiplexer 66 into "1", thereby enabling writing operation onto the FIFO buffer memory 62. Specifically, during the delay time $T_s$ from resuming a new frame, i.e., when the input address signals to the offset unit 54 lie within the offset address, the frame memory 58 is in a read mode and the FIFO buffer memory 62 is in a write mode. During that period previous pixel data is read from the frame memory 58 to a third adder 70 and added up with pixel difference signals, e.g., from an inverse DCT unit (not shown), to constitute pixel data of the current frame. The output from the third adder 70 is transferred therefrom for display and to the FIFO buffer memory 62 and written thereon. In other words, pixel signals of the first one slice and a next block, i.e., from block 0 to 90, of the current frame is written onto the FIFO buffer memory 62 and does not replace corresponding pixels in the frame memory 58 as shown in FIG. 4, wherein a) illustrates blocks of the previous frame read from the frame memory 58; b), blocks of the current frame written onto the FIFO frame memory 62; and c), blocks of the current frame written onto the frame memory 58, which are all drawn as a function of time.

When the input address signal to the offset unit 54 corresponds to the pixel positions outside of one slice and one block, i.e., belongs to blocks from 91 to 3599 in FIG. 2, the offset unit 54 provides "1" to the AND gate 60 and the second multiplexer 66 thereby causing both of them to generate signal "0" and "1" alternatively.

With the output "1" from the AND gate 60 and the second multiplexer 66, write address signal delayed by $T_s$ in the $T_s$ delay unit 52 is selected as the output A18–A0 by the first multiplexer 56 and fed to the frame memory 58 and writing mode is actuated therein by the signal "1" from the second multiplexer 66 thereby replacing with a pixel data of the current frame from the FIFO buffer memory 62 one pixel data of the previous frame at the address designated by the write address signal from the first multiplexer 56. With the output signal "0" from the AND gate 60 and the second multiplexer 66, a read address signal RA18–RA0 is selected by the first multiplexer 56 and applied to the frame memory 58 wherein a pixel data corresponding to the read address signal is read and transferred to the third adder 70. A input pixel difference signal is summed up with the pixel data from the frame memory 58 and transferred to a display unit (not shown) and the FIFO buffer memory 62 and written therein by the inverted signal "1" from the inverter 64. The read/write process is repeated continuously up to the end of the frame as shown in FIG. 4.

As a result, there is provided an inventive memory system with a reduced memory size for use in a receiver for decoding digitized video signals.

While the present invention has been described with respect to certain preferred embodiments only, other modifications and variations may be made without departing from the spirit and scope of the present invention as set forth in the following claims.

What is claimed is:

1. A memory system for use in a digital signal decoder employing a motion compensation technique, wherein motion compensated pixel values of a current frame are provided from pixel values of a previous frame through the use of difference signals and motion vectors determined within a predetermined motion search range, said memory apparatus comprising:

a first memory means for storing a portion of pixel values of the previous frame which will be used for the motion compensation of the current frame and a portion of the pixel values of the current frame in the rest part thereof and providing pixel values of the previous frame stored therein;

a second memory means for temporarily storing motion compensated pixel values of the current frame corresponding to an offset range, said offset range representing pixels of the previous frame stored in the first memory means which can not be replaced by the motion compensated pixels of the current frame stored in the second memory means because the pixels in the offset range are within the motion search range of pixels to be motion compensated;

means for generating a pixel clock signal;

means for generating a pixel address for each pixel included in the current frame in response to the pixel clock signal;

means for providing a read address signal from the pixel address and a corresponding motion vector inputted thereto;

means for generating a write address signal by delaying the pixel address for a predetermined time which corresponds to the time duration for generating pixel addresses for the pixels included in the offset range;

means for producing, in response to the pixel address, a first control signal which includes a read selection signal, a first read enable signal and a first write enable signal if the pixel address signal corresponds to one of the pixels within the offset range including a first pixel of the previous frame and providing said first control signal and a second control signal which includes a write selection signal, a second write enable signal and a second read enable signal, alternatively, within one cycle of the pixel clock signal if the pixel address corresponds to none of the pixels within the offset range including the first pixel of the previous frame;

means for selecting the read address signal and the write address signal in response to the read and write selection signals, respectively, thereby generating a read access signal or a write access signal; and means for generating a motion compensated pixel value of the current frame from a difference signal and a pixel value of the previous frame, wherein said second memory means stores the motion compensated pixel value of the current frame in response to the first write enable signal and provides the first memory means with the motion compensated pixel value of the current frame in a first-in-first-out manner in response to the second read enable signal, and wherein said first memory means provides, in response to the read address signal and the first read enable signal, a pixel value of the previous frame stored therein and storing, in response to the write address signal and second write enable signal, the motion compensated pixel value of the current frame.

* * * * *